(12) United States Patent
Qi et al.

(10) Patent No.: US 6,834,010 B1
(45) Date of Patent: Dec. 21, 2004

(54) TEMPERATURE DEPENDENT WRITE CURRENT SOURCE FOR MAGNETIC TUNNEL JUNCTION MRAM

(75) Inventors: Qiuqun Qi, Fremont, CA (US); Xizeng Shi, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 10/741,841

(22) Filed: Dec. 18, 2003

Related U.S. Application Data

(62) Division of application No. 10/017,925, filed on Dec. 7, 2001, now Pat. No. 6,687,178.
(60) Provisional application No. 60/271,322, filed on Feb. 23, 2001.

(51) Int. Cl.[7] .............................................. G11C 7/00
(52) U.S. Cl. .............................. 365/185.05; 365/189.11
(58) Field of Search ....................... 365/189.05, 189.11; 327/543, 198

(56) References Cited

U.S. PATENT DOCUMENTS

| | | | |
|---|---|---|---|
| 5,604,467 A | * | 2/1997 | Matthews .................... 331/176 |
| 5,818,294 A | * | 10/1998 | Ashmore, Jr. ................ 327/543 |
| 5,940,319 A | | 8/1999 | Durlam et al. |
| 6,087,620 A | * | 7/2000 | Brooks et al. .......... 219/121.64 |
| 6,111,783 A | | 8/2000 | Tran et al. |
| 6,174,737 B1 | | 1/2001 | Durlam et al. |
| 6,185,143 B1 | | 2/2001 | Perner et al. |
| 6,317,376 B1 | | 11/2001 | Tran et al. |
| 6,348,832 B1 | * | 2/2002 | Chih .......................... 327/538 |
| 6,418,046 B1 | | 7/2002 | Naji |
| 6,603,678 B2 | | 8/2003 | Nickel et al. |
| 6,608,790 B2 | | 8/2003 | Tran et al. |
| 6,687,178 B1 | | 2/2004 | Qi et al. |

* cited by examiner

*Primary Examiner*—Vu A. Le
(74) *Attorney, Agent, or Firm*—Carr & Ferrell LLP

(57) ABSTRACT

An MRAM storage device includes temperature dependent current sources that adjust their outputs as temperature varies. Temperature dependent current sources include one or more diodes connected to a transistor. As temperature varies so does the voltage drop across the diodes. In addition, the MRAM data storage device includes at least one digit line, at least one bit line, and at least one MRAM cell disposed proximate to a junction of a digit line and a bit line. Each end of each digit line is connected to temperature dependent current sources and current sinks. One end of each bit line is connected to a temperature dependent current source while the other end of each bit line is connected to a current sink. Two logic signals R and D are used to activate a write operation and determine the direction of the write current in the digit line.

21 Claims, 6 Drawing Sheets

| 605 | 610 | 615 | 620 | 625 | 630 |
|---|---|---|---|---|---|
| D | R | $\overline{D}$ | D+R | $\overline{D+R}$ | $\overline{R}$ |
| 0 | 0 | 1 | 1 | 0 | 1 |
| 1 | 0 | 0 | 0 | 1 | 1 |
| 0 | 1 | 1 | 0 | 0 | 0 |
| 1 | 1 | 0 | 0 | 0 | 0 |

FIG. 6  600

TEMPERATURE DEPENDENT WRITE CURRENT SOURCE FOR MAGNETIC TUNNEL JUNCTION MRAM

This application is a divisional application and claims the priority benefit of U.S. patent application Ser. No. 10/017,925 filed Dec. 7, 2001 now U.S. Pat. No. 6,687,178, entitled "Temperature Dependent Write Current Source for Magnetic Tunnel Junction MRAM," which claims the benefit of U.S. Provisional Application No. 60/271,322 filed Feb. 23, 2001, which is hereby incorporated by reference.

BACKGROUND

1. Field of the Invention

The present invention relates generally to data storage and more particularly to temperature dependent current sources for selectively writing to Magnetic Random Access Memory (MRAM) units.

2. Description of the Prior Art

A wide range of presently available media for data storage vary in several attributes including access speed, duration of reliable storage, and cost. Static Random Access Memory (SRAM) is the storage medium with the best access speed for the cost in applications such as cache memories. However, SRAM is volatile, meaning that it only maintains storage while power is continuously applied. Accordingly, computer users endure lengthy waits when they power-up their computers while substantial amounts of data are written from non-volatile but slow media, such as magnetic disks, into much faster random access memory (SRAM).

Flash memory has been proposed as an alternative to SRAM. Flash memory is a solid-state storage medium that provides; moderate access times and that is non-volatile. Flash memory has the disadvantage that it has a limited lifetime, on the order of one million cycles per cell, after which a cell can no longer be written to. This lifetime is orders of magnitude too short for a random access memory in most modern computing systems.

Another solid-state storage medium is Magnetic Random Access Memory (MRAM), which employs a Magnetic Tunnel Junction (MTJ) formed of layers of magnetic material. FIG. 1 shows a cross-section of a prior art MRAM unit 10 including an MTJ 12 formed of a pinned layer 14 and a free layer 16, which are magnetic layers typically formed of ferromagnetic materials, and a thin dielectric layer 18 disposed between layers 14 and 16. Pinned layer 14 has a magnetic moment orientation 20 that is fixed from rotating, while free layer 16 has a magnetic moment orientation 22 that is free to rotate in response to external magnetic fields. Methods of pinning a pinned layer 14 are well known in the art and include the use of an adjacent antiferromagnetic layer (not shown).

In an MRAM unit 10, a bit of data is encoded in the direction of the magnetic moment orientation 22 of the free layer 16 relative to the magnetic moment orientation 20 of the pinned layer 14. As is well known in the art, when the two magnetic moment orientations 20, 22 are parallel the resistance measured across the MTJ 12 is relatively low, and when the two magnetic moment orientations 20, 22 are antiparallel the resistance measured across the MTJ 12 is relatively high. Accordingly, the relative state of the magnetic moment orientations 20, 22, either parallel or antiparallel to one another, can be determined by reading the resistance across the MTJ 12 with a read current. Typical read currents are on the order of 1–50 $\mu$A.

In an MRAM unit 10, the state of the bit, parallel or antiparallel and representing 0 or 1, for example, is varied by applying a write current Iw, typically on the order of 1–25×A, through two conductors, a bit line 24 and a digit line 26, situated proximate to the MTJ 12. The intensity of the write current applied to the bit line 24 may be different than that applied to the digit line 26. The bit line 24 and the digit line 26 cross one another at right angles above and below the MTJ 12. As is well known in the art, although the pinned layer 14 is depicted in FIG. 1 as nearer to the bit line 24, an MRAM unit 10 also functions with the pinned layer 14 nearer to the digit line 26.

As is well known, a magnetic field develops around an electric current in a wire. Accordingly, two magnetic fields arise when write currents Iw are simultaneously applied to both the bit line 24 and the digit line 26. The two magnetic fields combine at the free layer 16 to determine the magnetic moment orientation 22. The magnetic moment orientation 22 of the free layer 16 is made to alternate between the parallel and antiparallel states by alternating the direction of the write current Iw in either the bit line 24 or the digit line 26. Alternating (by a write control circuit, not shown) the direction of the write current Iw in one of the lines 24, 26 reverses the direction of the magnetic field around that conductor and thereby reverses the direction of the combined magnetic field at the free layer 16.

The intensity of the write current required to alternate the magnetic moment orientation 22 between parallel and antiparallel states is dependent upon the temperature. For example, a larger write current is needed to change the bit state of a first MRAM unit at a low temperature than is needed to change the bit state of a second MRAM unit at a high temperature. Consequently, for a fixed write current intensity, when the temperature is low an MRAM unit may not switch bit states when written to by read/write circuitry, and when the temperature is high the MRAM unit may unexpectedly switch bit states when the read/write circuitry writes to other MRAM units. Accordingly, what is desired is write control circuitry for an MRAM unit that provides reliable magnetic data storage independent of temperature.

SUMMARY

In accordance with the present invention, a magnetic tunnel junction MRAM data storage device with temperature dependent current sources is disclosed. The temperature dependent current sources provide a write current Iw to each MRAM unit of the magnetic tunnel junction MRAM data storage device for alternating between bit states. Each temperature dependent current source has a negative temperature coefficient $\alpha$, where $\alpha = a\, \partial w/\partial T$, and T is the temperature.

One embodiment of a temperature dependent current source includes a first transistor, electronic circuitry, and a write current voltage source. In this embodiment, the electronic circuitry is electronically coupled to the write current voltage source for generating a first temperature dependent voltage, and the first transistor is driven by the first temperature dependent voltage for generating a temperature dependent write current. The electronic circuitry includes one or more diodes and a second transistor connected in series.

In another embodiment of a temperature dependent current source, the electronic circuitry includes additional electronic circuitry for generating the first temperature dependent voltage. The additional electronic circuitry includes a third and a fourth transistor connected in series with the write current voltage source, and the gate of the third transistor is driven by the second transistor.

One embodiment of the magnetic tunnel junction MRAM data storage device includes a memory array having one or more MRAM cells, one or more digit lines, one or more bit lines, digit line transistors, bit line transistors, a column decoder for selecting one of the digit lines, a row decoder for selecting one of the bit lines, digit line current sink transistors, a bit line current sink transistor, current source transistors, temperature dependent write current sources, current sinks, and write control logic gates. Each MRAM cell includes a magnetic tunnel junction (MTJ) and a read transistor, and each MRAM cell is disposed proximate to an intersection of one of the digit lines and one of the bit lines.

BRIEF DESCRIPTION OF DRAWINGS

The present invention is illustrated by way of example, and not by way of limitation, in the figures of the accompanying drawings where like reference numerals refer to similar elements and in which:

FIG. 6 is a gate logic table according to an embodiment of the present invention.

DETAILED DESCRIPTION OF THE INVENTION

Figure 1:
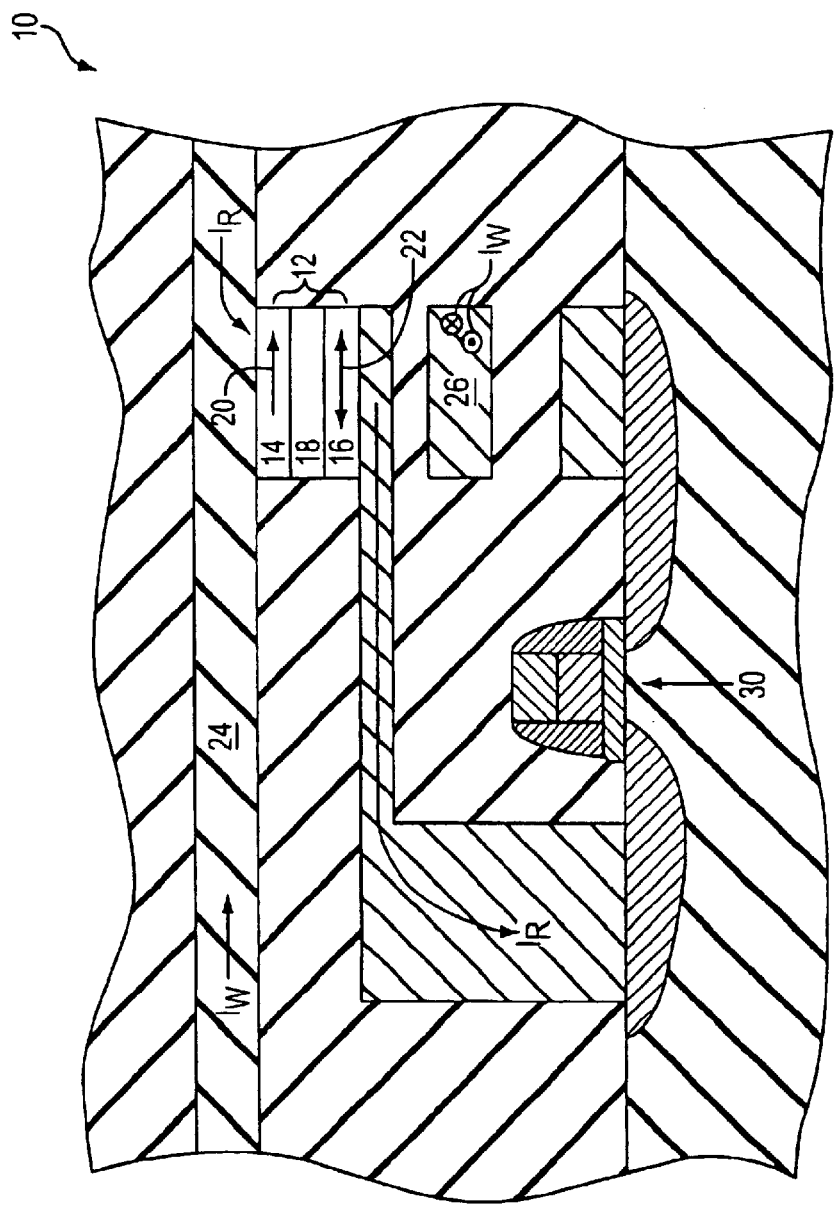
FIG. 1 is a cross-sectional representation of a MRAM unit of the prior art.
Figure 2:
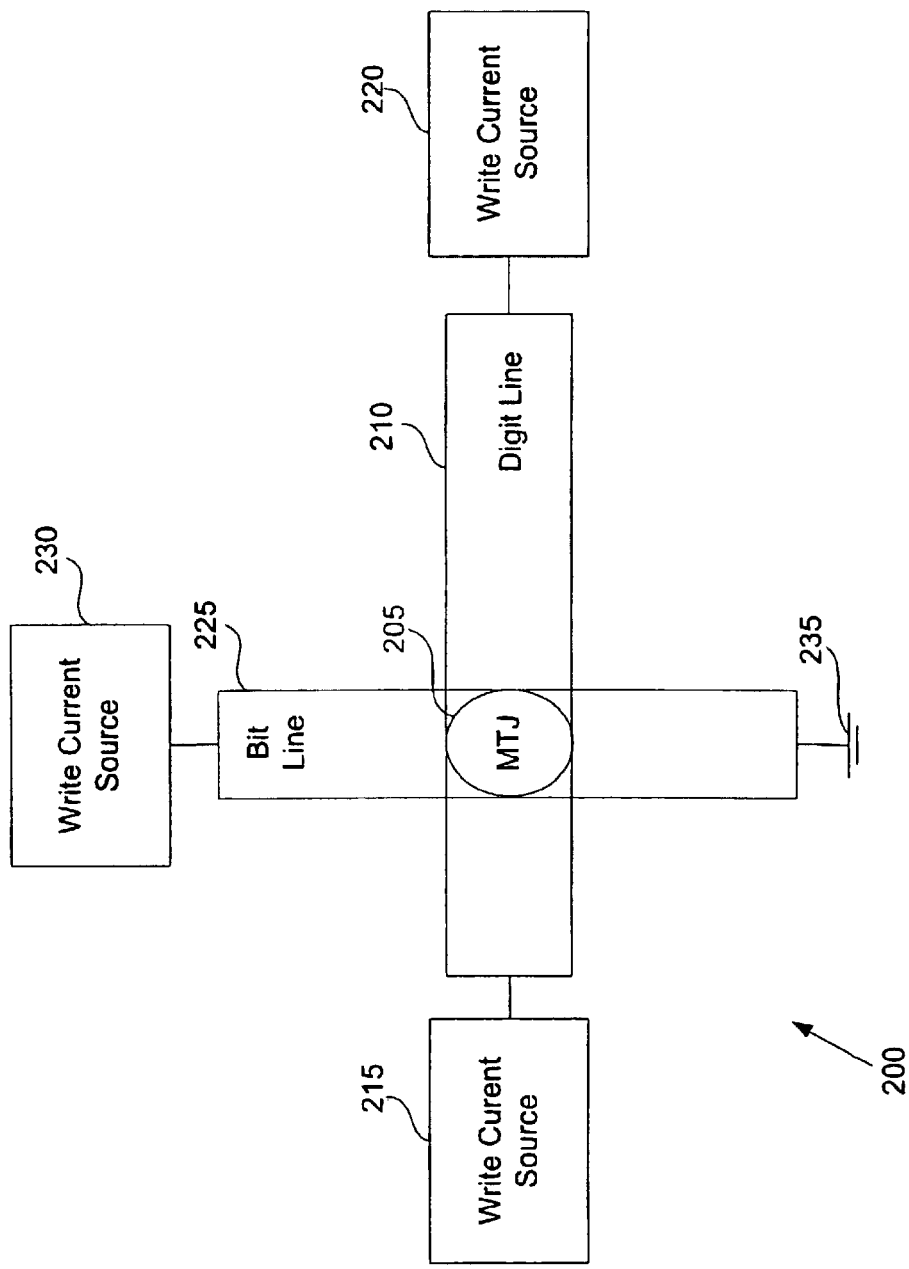
FIG. 2 is a block diagram of MRAM unit architecture according to an embodiment of the present invention.

FIG. 2 is a block diagram of MRAM architecture 200, according to the invention. MRAM architecture 200 includes a magnetic tunnel junction (MTJ) 205, a digit line 210, a first temperature dependent digit line write current source 215, a second temperature dependent digit line write current source 220, a bit line 225, a temperature dependent bit line write current source 230, and a current sink 235. MTJ 205 is disposed between bit line 225 and digit line 210 where they cross one another, however bit line 225 and digit line 210 are not electrically connected. In the FIG. 2 embodiment of the present invention, current may flow in either direction in digit line 210, whereas current flows in a single direction in bit line 225. In another embodiment of the present invention, current may flow in either direction in bit line 225, whereas current flows in a single direction in digit line 210.

During a write operation, a write current flows from bit line temperature dependent write current source 230 to current sink 235 via bit line 225. In addition, a write current flows in a first direction or a second direction in digit line 210. For example, first temperature dependent digit line write current source 215 may generate a first direction write current that flows in the first direction in digit line 210 from first temperature dependent digit, line write current source 215 to a current sink (not shown) associated with second temperature dependent digit line write current source 220. Alternatively, second temperature dependent digit line write current source 220 may generate a second direction write current that flows in the second direction in digit line 210 from second temperature dependent digit line write current source 220 to a current sink (not shown) associated with first temperature dependent digit line write current source 215. Write control circuitry (not shown) selects the direction of current flow in digit line 210 as will be discussed further below in conjunction with FIG. 5.

Figure 3:
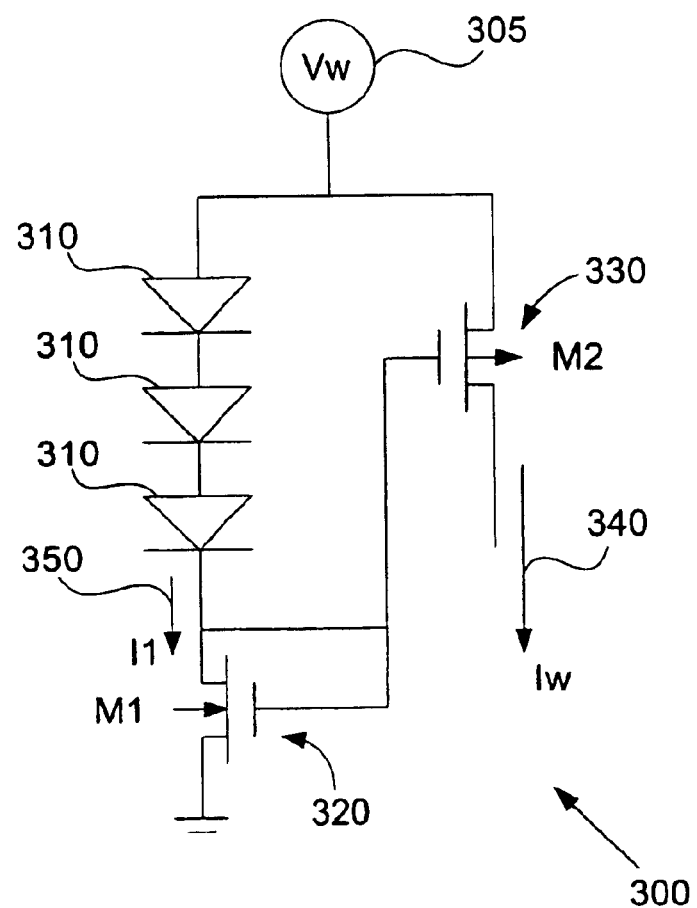
FIG. 3 is a temperature dependent current source according to one embodiment of the present invention.

FIG. 3 is one embodiment of a temperature dependent write current source 300. Temperature dependent write current source 300 includes a write source voltage 305, diodes 310, a transistor M1 320, and a transistor M2 330. As is well known, a flow of current from a source to a drain in a transistor can be controlled by changing a voltage applied to a gate of the transistor. In the FIG. 3 embodiment of the current invention, transistor M1 320 is an n-channel MOSFET and transistor M2 330 is a p-channel MOSFET. However, the scope of the present invention covers any combination of p-channel and n-channel MOSFETS. Write current source 300 generates a current Iw 340 that is temperature dependent. The scope of the present invention covers a wide range of operating temperatures for write current source 300, however typical operating temperatures include the range of −50° Celsius to 125° Celsius. The intensity of current Iw 340 is dependent upon the temperature coefficient of diodes 310 and the number of diodes 310 electrically connected in series. Although the embodiment of write current source 300 shown in FIG. 3 includes three diodes 310, the scope of the present invention includes current sources with a single diode as temperature-sensitive devices. In other embodiments of the present invention, diodes 310 may be replaced by other types of temperature-sensitive electronic devices, such as bipolar transistors or resistors, for example.

As the temperature of write current source 300 increases, the voltage drop across diodes 310 decreases and the gate voltage of transistor M1 320 increases. Since the gate and drain of transistor M1 320 are at the same voltage, transistor M1 320 operates in the saturation regime and a current I1 350 flowing through diodes 310 and transistor M1 320 is approximately constant. Since the gate of transistor M1 320 is electrically connected to the gate of transistor M2 330, the gate voltage of transistor M1 320 is always equal to the gate voltage of transistor M2 330. Therefore, as the gate voltage of transistor M2 330 increases with an increase in temperature, the absolute value of the voltage between the gate and the source of transistor M2 330 decreases, and the current Iw 340 flowing through transistor M2 330 decreases.

The temperature coefficient of current source 300 is dependent upon the number of diodes 310 and the temperature coefficient of diodes 310, where the temperature coefficient of current source 300 is $\alpha=\partial I_w/\partial T$ and the temperature coefficient of diodes 310 is $\alpha_d=\partial I_1/\partial T$. The temperature coefficient $\alpha$ of current source 300 is a negative number, since current Iw 340 decreases as the temperature increases. Normalized values of $\alpha_N$, where $\alpha_N=$/Iw, typically range from −0.001° C.$^{-1}$ to −0.003° C.$^{-1}$. The scope of the present invention includes current sources with any value of temperature coefficient $\alpha$, where a value of the temperature coefficient $\alpha$ depends upon the number of diodes and upon the temperature coefficient $\alpha_d$ of each diode.

Figure 4:
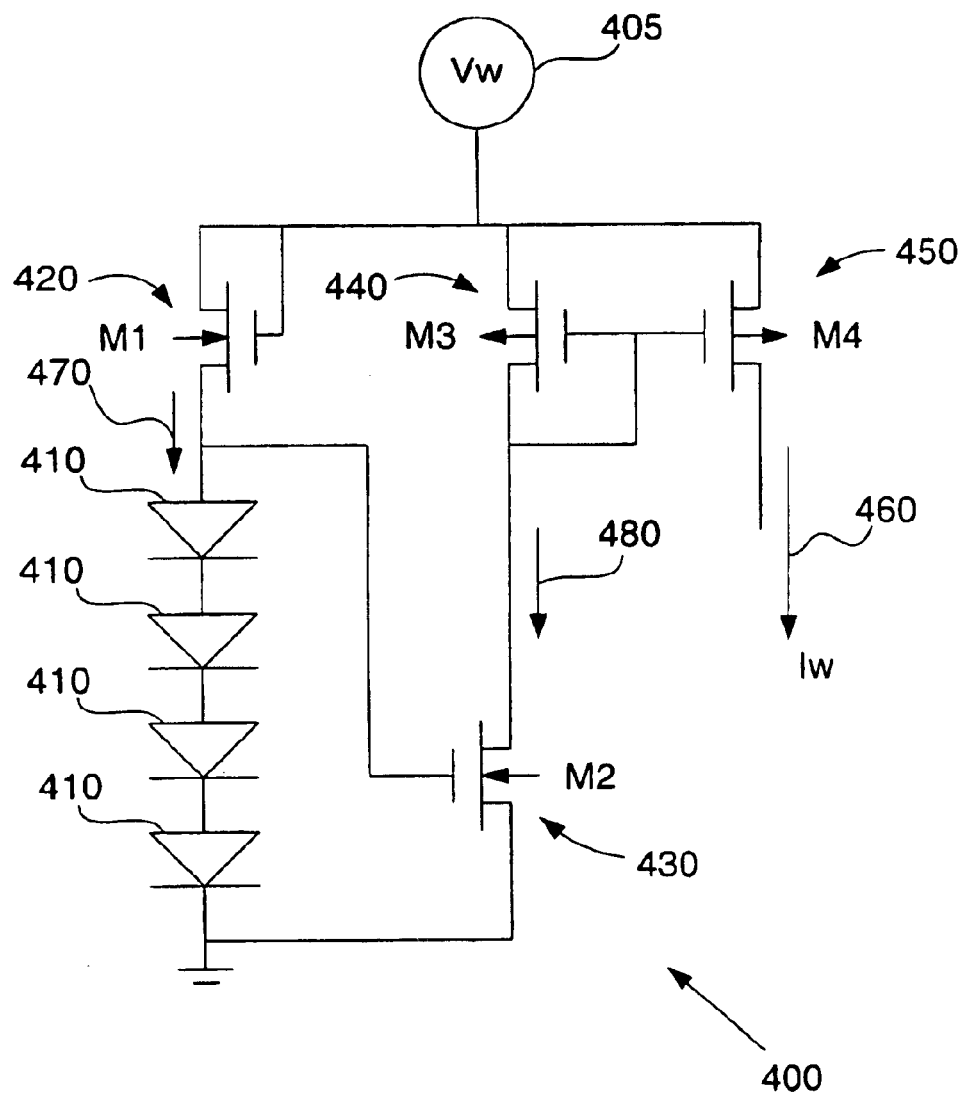
FIG. 4 is a temperature dependent current source according to another embodiment of the present invention.

FIG. 4 is another embodiment of a temperature dependent write current source 400. Temperature dependent write current source 400 includes a write source voltage 405, diodes 410, a transistor M1 420, a transistor M2 430, a transistor M3 440, and a transistor M4 450. Preferably, the transistors are n-channel MOSFETS and p-channel MOSFETS, however the scope of the present invention covers any transistor type. In the FIG. 4 embodiment of the invention, transistor M1 420 is an n-channel MOSFET, transistor M2 430 is an n-channel MOSFET, transistor M3

440 is a p-channel MOSFET, and transistor M4 450 is a p-channel MOSFET, however the scope of the invention covers any combination of p-channel and n-channel MOSFETs. Write current source 400 generates a current Iw 460 that is dependent upon temperature. Specifically, current Iw 460 depends upon the temperature coefficient of diodes 410 and the number of diodes 410 electrically connected in series. Although the embodiment of write current source 400 shown in FIG. 4 includes four diodes 410, the scope of the present invention includes current sources with any number of diodes electrically connected in series. In addition, current Iw 460 may be adjusted by changing the width to length ratio. (W/L) of the p-channel regions (not shown) of transistor M3 440 and transistor M4 450.

As the temperature increases, the voltage drop across diodes 410 decreases and the gate-to-drain voltage of transistor M2 430 decreases. Since the gate and drain of transistor M1 420 are at the same voltage, transistor M1 420 operates in the saturation regime and current I1 470 flowing through diodes 410 and the transistor M1 420 is approximately constant. The decrease in gate-to-drain voltage of transistor M2 430 causes a decrease of current I2 480 in transistor M2 430 and transistor M3 440. Since transistor M3 440 and transistor M4 450 constitute a mirror current source, that is, the current in transistor M4 450 is always equal to the current in transistor M3 440, current Iw 460 in transistor M4 450 decreases when current I2 480 in transistor M3 440 decreases.

The temperature coefficient of current source 400 is dependent upon the number of diodes 410 and the temperature coefficient of diodes 410, where the temperature coefficient of current source 400 is $\alpha = \partial I_w / \partial T$ and the temperature coefficient of diodes 410 is $\alpha_d = \partial I_1 / \partial T$. The temperature coefficient $\alpha$ of current source 400 is a negative number, since current Iw 460 decreases as the temperature increases. The scope of the present invention includes current sources with any value of temperature coefficient $\alpha$, where a value of the temperature coefficient at depends upon the number of diodes and upon the temperature coefficient ad of each diode. In addition, for any given temperature, number of diodes, and diode temperature coefficients, current Iw 460 may be changed by adjusting the W/L ratio of transistor M3 440, for example.

Figure 5:
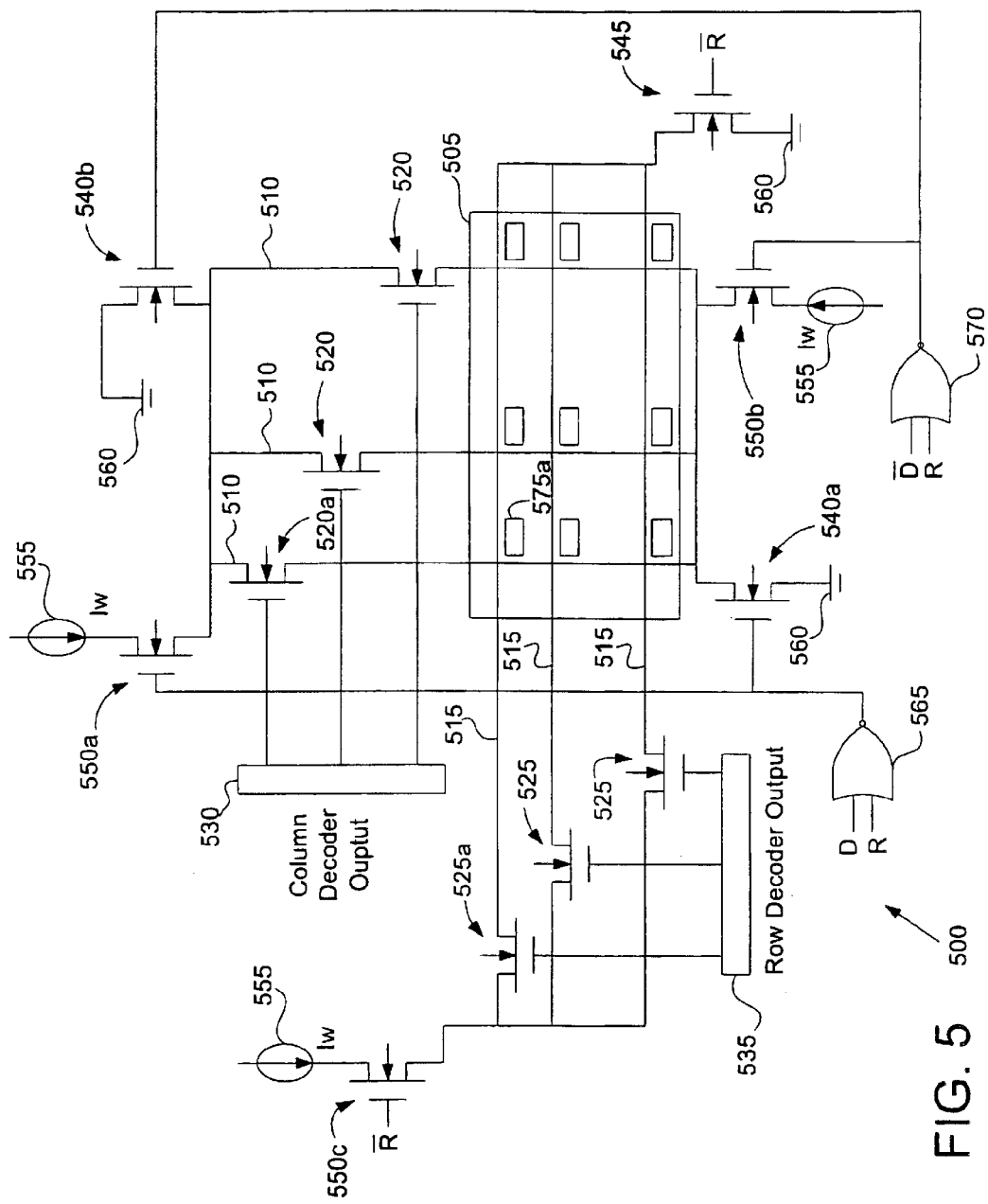
FIG. 5 shows writing architecture of a magnetic tunnel junction MRAM data storage device according to an embodiment of the present invention.

FIG. 5 shows writing architecture of a magnetic tunnel junction MRAM data storage device 500 of the invention. In FIG. 5, there is a node wherever a line representing a conductor terminates at another line representing a conductor, whereas wherever two such lines cross one another there is not a node. The data storage device 500 includes a memory array 505, bit lines 510, digit lines 515, bit line transistors 520, digit line transistors 525, a column decoder 530 for selecting one of the bit lines 510, a row decoder 535 for selecting one of the digit lines 515, bit line current sink transistors 540, a digit line current sink transistor 545, current write transistors 550, temperature dependent write current sources 555, current sinks 560, a logic NOR gate 565, and a logic NOR gate 570. In addition, memory array 505 includes a plurality of MRAM cells 575, where each MRAM cell 575 includes a magnetic tunnel junction (MTJ) (not shown) and a read transistor (not shown), and each MRAM cell 575 is disposed proximate to an intersection of one of the bit lines 510 and one of the digit lines 515. Each temperature dependent write current source 555 may be either a temperature dependent write current source 300 or a temperature dependent write current source 400.

In the FIG. 5 embodiment of the invention, each transistor is an n-channel MOSFET. For example, a high voltage applied to a gate of an n-channel MOSFET activates the transistor, causing current to flow in the transistor. A low voltage applied to a gate of an n-channel transistor. A high voltage is designated by a logic signal 1, and a low voltage is designated by a logic signal 0.

During a write operation, column decoder 530 selects one of the bit lines 510 by applying a logic signal 1 to a gate of one of the bit line transistors 520. Then either a first direction for the write current in the selected bit line 510 is chosen by activating current write transistor 550a and bit line current sink transistor 540a via the output of NOR gate 565, or a second direction for the write current in the selected bit line is chosen by activating current write transistor 550b and bit line current sink transistor 540b via the output of NOR gate 570. In addition, row decoder 535 selects one of the digit lines 515 by applying a logic signal 1 to one of the digit line transistors 525. Once a digit line 515 is selected, current write transistor 550c and digit line current sink transistor 545 are activated by applying a logic signal $\overline{R}=1$ to the gate of current write transistor 550c and by applying a logic signal $\overline{R}=1$ to the gate of digit line current sink transistor 545, causing a digit line write current to flow in the selected digit line 515.

In an alternative embodiment of the present invention, current flow in the digit lines is bi-directional with both ends of each digit line connected to a current source and a current sink, and current flow in the bit lines is fixed in one direction with one end of each bit line connected to a current source and the opposite end of each bit line connected to a current sink.

FIG. 6 shows a logic table 600 for activating current write and current sink transistors. FIG. 6 includes a column of D logic signal states 605, a column of R logic signal states 610, a column of complement D logic signal states 615, a column of NOR gate 565 output logic signal states 620, a column of NOR gate 570 output logic signal states 625, and a column of complement R logic signal states 630. The state of the D logic signal indicates the direction of current in a selected bit line and the state of the R logic signal indicates whether a data storage device is operating in a read or write mode. In the FIG. 5 embodiment of the invention, a R=1 state indicates a read operation and a R=0 state indicates a write operation. For example, the first row of logic table 600 corresponds to a write state (R=0) of data storage device 500 associated with a first direction of write current (D=0), where the NOR gate 565 output logic signal value 620 is high (logic value 1), the NOR gate 570 output logic signal value 625 is low (logic value 0), and signal $\overline{R}$ applied to the gates of current write transistor 550c and digit line current sink transistor 545 is high (logic value 1).

The second row of logic table 600 corresponds to a write state (R=0) of data storage device 500 associated with a second direction of write current (D=1), where the NOR gate 565 output logic signal value 620 is low (logic value 0), the NOR gate 570 output logic signal value 625 is high (logic value 1), and signal $\overline{R}$ applied to the gates of current write transistor 550c and digit line current sink transistor 545 is high (logic value 1) For example, referring back to FIG. 5, a first bit state associated with the first direction of write current is written to MTJ 575a when (1) logic signal states are given by the first row of FIG. 6, (2) column decoder 530 applies a high signal (logic value 1) to the gate of bit line transistor 520a, and (3) row decoder applies a high signal (logic value 1) to the gate of digit line transistor 525a. A second bit state associated with the second direction of write current is written to MTJ 575a when (1) logic signal states are given by the second row of FIG. 6, (2) column decoder 530 applies a high signal (logic value 1) to the gate of bit line transistor 520a, and (3) row decoder applies a high signal (logic value 1) to the gate of digit line transistor 525a.

In the foregoing specification, the invention is described with reference to specific embodiments thereof, but those skilled in the art will recognize that while the invention is not limited thereto. For example, the scope of the invention includes other combinations of p-channel and n-channel transistors with other combinations of logic gates to enable the selection of bit and digit lines and to enable the activation of current source transistors. Various features and aspects of the above-described invention may be used individually or jointly. Further, although the invention has been described in the context of its implementation in a particular environment and for particular applications, its usefulness is not limited thereto and it can be utilized in any number of environments and applications without departing from the broader spirit and scope thereof The specification and drawings are, accordingly, to be regarded as illustrative rather than restrictive.

What is claimed is:

1. A temperature dependent current source for generating a current, comprising:

a current source voltage;

electronic circuitry coupled to the current source voltage for generating a first temperature dependent voltage; and a first transistor electrically coupled to the current source voltage and the electronic circuitry and including a gate controlled by the first temperature dependent voltage, wherein an intensity of the current decreases as temperature increases.

2. The temperature dependent current source of claim 1, wherein the electronic circuitry includes one or more diodes electrically coupled.

3. The temperature dependent current source of claim 2, wherein the electronic circuitry further includes a second transistor electrically coupled to the one or more diodes.

4. The temperature dependent current source of claim 3, wherein a drain of the second transistor is electrically coupled to a gate of the second transistor.

5. The temperature dependent current source of claim 4, wherein the second transistor is an n-channel MOSFET.

6. The temperature dependent current source of claim 4, wherein a voltage at the drain of the second transistor is the first temperature dependent voltage.

7. The temperature dependent current source of claim 6, wherein the first transistor is a p-channel MOSFET.

8. The temperature dependent current source of claim 7, wherein an intensity of the current decreases as temperature increases.

9. The temperature dependent current source of claim 1, wherein the first transistor is a p-channel MOSFET.

10. The temperature dependent current source of claim 4, wherein a voltage at a source of the second transistor is a second temperature dependent voltage.

11. The temperature dependent current source of claim 10, wherein the second transistor is an n-channel MOSFET.

12. The temperature dependent current source of claim 10, wherein the electronic circuitry further includes additional electronic circuitry coupled to the second transistor for generating the first temperature dependent voltage.

13. The temperature dependent current source of claim 12, wherein the additional electronic circuitry further includes a third transistor electrically coupled to a fourth transistor, the fourth transistor having a gate controlled by the second temperature dependent voltage.

14. The temperature dependent current source of claim 13, wherein a gate and a drain of the third transistor are electrically coupled to a drain of the fourth transistor.

15. The temperature dependent current source of claim 14, wherein a voltage at the gate of the third transistor is the first temperature dependent voltage.

16. The temperature dependent current source of claim 15, wherein the fourth transistor is an n-channel MOSFET.

17. The temperature dependent current source of claim 16, wherein the third transistor is a p-channel MOSFET.

18. The temperature dependent current source of claim 17, wherein the first transistor is a p-channel MOSFET.

19. The temperature dependent current source of claim 18, wherein an intensity of the current decreases as temperature increases.

20. The temperature dependent current source of claim 12, wherein the first transistor is a p-channel MOSFET.

21. The temperature dependent current source of claim 20, wherein an intensity of the current decreases as temperature increases.

* * * * *